United States Patent
Liu et al.

(10) Patent No.: US 8,149,564 B2
(45) Date of Patent: Apr. 3, 2012

(54) MEMS CAPACITIVE DEVICE AND METHOD OF FORMING SAME

(75) Inventors: Lianjun Liu, Chandler, AZ (US); Melvy F. Miller, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 543 days.

(21) Appl. No.: 12/391,083

(22) Filed: Feb. 23, 2009

(65) Prior Publication Data
US 2010/0214716 A1     Aug. 26, 2010

(51) Int. Cl.
    *H01G 5/00*      (2006.01)
    *H01G 7/00*      (2006.01)
(52) U.S. Cl. ........................ 361/277; 29/25.42
(58) Field of Classification Search .............. 361/277, 361/283.1, 283.2, 283.3, 283.4, 290; 29/25.42
See application file for complete search history.

(56) References Cited

U.S. PATENT DOCUMENTS
4,933,807 A *   6/1990   Duncan ............... 361/283.2
* cited by examiner

*Primary Examiner* — Eric Thomas
(74) *Attorney, Agent, or Firm* — Meschkow & Gresham, P.L.C.

(57) ABSTRACT

A MEMS capacitive device (90) includes a fixed capacitor plate (104) formed on a surface (102) of a substrate (100). A movable capacitor plate (114) is suspended above the fixed capacitor plate (104) by compliant members (116) anchored to the surface (102). A movable element (120) is positioned in spaced apart relationship from the movable capacitor plate (104) and has an actuator (130) formed thereon. Actuation of the actuator (130) causes abutment of a portion of the movable element (120) against a contact surface (136) of the movable plate (114). The abutment moves the movable plate (114) toward the fixed plate (104) to alter a capacitance (112) between the plates (104, 114). Another substrate (118) may be coupled to the substrate (100) such that a surface (126) of the substrate (118) faces the surface (102) of the substrate (100). The movable element (120) may be formed on the surface (126).

14 Claims, 8 Drawing Sheets

MEMS CAPACITIVE DEVICE AND METHOD OF FORMING SAME

TECHNICAL FIELD OF THE INVENTION

The present invention relates generally to microelectromechanical systems (MEMS) devices. More specifically, the present invention relates to a MEMS capacitive device with separate actuator and capacitor plates and method of forming same.

BACKGROUND OF THE INVENTION

Microelectromechanical systems (MEMS) variable capacitive devices are components implemented in a number of systems including, for example, reconfigurable radio-frequency (RF) systems. MEMS variable capacitive devices are tunable capacitors that enable either binary states of capacitance (e.g., C1 and C2) or continuously variable states of capacitance over a range of values. In a tunable parallel plate capacitor, change in capacitance is effected by varying the distance between the metal layers forming the capacitor plates via an actuation method, such as piezoelectric and/or electrostatic actuation. Upon actuation, the distance between the capacitor plates is tuned via one or more springs, to which one of the plates is attached. Of increasing interest is the implementation of piezoelectric capacitors in low power consumption, miniaturized systems due to their low actuation voltage requirements and low consumption power.

FIG. 1 shows a side view of a prior art MEMS capacitive device 20 formed using a single substrate surface micromachining process. Capacitive device 20 includes a substrate 22 having a surface 24. A fixed capacitor plate 26 is formed on surface 24. A movable element 32 includes first and second ends 34 and 36, respectively, also coupled to surface 24 of substrate 22. An intermediate section 38 of movable element 32 spans between first and second ends 34 and 36.

A movable metal capacitor plate 40 is formed on an inner surface 42 of intermediate section 38 overlying fixed capacitor plate 26. A pair of piezoelectric actuators 44 and 46 are also formed on inner surface 42 of intermediate section 38. Actuation of actuators 44 and 46 causes intermediate section 38 to flex toward surface 24 of substrate 22, thereby altering a capacitance 48 between a contact surface 49 of fixed capacitor plate 26 and movable capacitor plate 40.

MEMS capacitive device 20 is also illustrated to include a pair of elements 28 and 30 formed on surface 24. Elements 28 and 30 are arranged on opposing sides of fixed capacitor plate 26, with element 28 facing actuator 44 and element 30 facing actuator 46. Elements 28 and 30 shown in FIG. 1 reflect optional electrodes which could be used with actuators 44 and 46 to cause intermediate section 38 to flex toward surface 24 of substrate 22 by electrostatic actuation. Actuators 44 and 46 could then be either piezoelectric actuators, electrostatic actuator electrodes, or a combination of both.

One difficulty in designing and fabricating a MEMS parallel plate capacitor, such as capacitive device 20, is to achieve acceptable process tolerance while concurrently achieving successful device reproducibility in mass production. This difficulty is exacerbated when using piezoelectric actuation in the MEMS capacitor. For example, actuators 44 and 46 may be piezoelectric actuators, in order to achieve the advantages of low actuation voltage requirements and low consumption power. However, fabrication processes for piezoelectric material requires high temperature annealing (e.g., six hundred to seven hundred degrees Celsius). The high temperature processing can result in stress and thermal mismatch effects that adversely affect capacitor yield and capacitor accuracy in a single substrate device, such as MEMS capacitive device 20.

FIG. 2 shows a side view of a prior art MEMS capacitive device 50 formed using surface micromachining and substrate bonding processes. Capacitive device 50 includes a substrate 52 having a surface 54. A fixed capacitor plate 56 is formed on surface 54. Capacitive device 50 further includes another substrate 62 bonded to substrate 52. A movable element 66 includes first and second ends 68 and 70, respectively, coupled to a surface 64 of substrate 62. An intermediate section 72 of movable element 66 spans between first and second ends 68 and 70.

A movable metal capacitor plate 74 is formed on an outer surface 76 of intermediate section 72 overlying fixed capacitor plate 56. A pair of piezoelectric actuators 78 and 80 are also formed on outer surface 76 of intermediate section 72. Actuation of actuators 78 and 80 causes intermediate section 72 to flex toward surface 54 of substrate 52, thereby altering a capacitance 82 between fixed capacitor plate 56 and a contact surface 84 of movable capacitor plate 74.

MEMS capacitive device 50 is also illustrated to include a pair of elements 58 and 60 formed on surface 54. Elements 58 and 60 are arranged on opposing sides of fixed capacitor plate 56, with element 58 facing actuator 78 and element 60 facing actuator 80. Elements 58 and 60 shown in FIG. 2 reflect optional electrodes which could be used with actuators 78 and 80 to cause intermediate section 72 to flex toward surface 54 of substrate 52 by electrostatic actuation. Actuators 78 and 80 could then be either piezoelectric actuators, electrostatic actuator electrodes, or a combination of both.

In this capacitive device 50, the issues of stress and thermal mismatch are mitigated by forming piezoelectric actuators 78 and 80 separate from the underlying fixed capacitor plate 56. However, a surface micromachining process is a build-up technique based on the deposition and etching of different structural and sacrificial layers on top of the substrate. Consequently, contact surface 49 (FIG. 1) of capacitor plate 40 (FIG. 1) is exposed following removable of a sacrificial layer (not shown). In contrast, movable metal capacitor plate 74 is formed as a top layer, and contact surface 84 is a "top" surface.

A sacrificial layer can be deposited to have a very smooth surface. As such, an overlying structural layer, such as contact surface 49 of capacitor plate 40 can be commensurately smooth. However, contact surface 84 of capacitor plate 74 is rough relative to that of contact surface 49 due to the grain size of the metal of capacitor plate 74. Unfortunately, the roughness of contact surface 84 leads to poor reproducibility.

Accordingly, there is a need for an improved MEMS capacitive device and fabrication methodology for overcoming the problems in the art as discussed above.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

An embodiment entails a microelectromechanical systems (MEMS) capacitive device having separate actuators and capacitor plates. Another embodiment entails a method of fabricating the MEMS capacitive device using surface micromachining and substrate bonding processes. The MEMS capacitive device includes piezoelectric actuators formed on a movable element that is physically separate from fixed and movable capacitor plates of a parallel plate capacitor. The term "physically separate" refers to a configuration in which the movable element and actuators on the movable element form a separate structure that is not in physical contact with the fixed and movable capacitor plates unless the MEMS capacitive device is actuated. Actuation of the MEMS capacitive device causes abutment of the movable element against the movable capacitor plate, which moves the movable capacitor plate toward the fixed capacitor plate to alter a capacitance between the movable and fixed capacitor plates. The MEMS capacitive device and fabrication methodology mitigates problems associated with stress and thermal mismatch, contact surface roughness, and so forth to achieve acceptable process tolerance while concurrently achieving successful device reproducibility in mass production.

Figure 1:
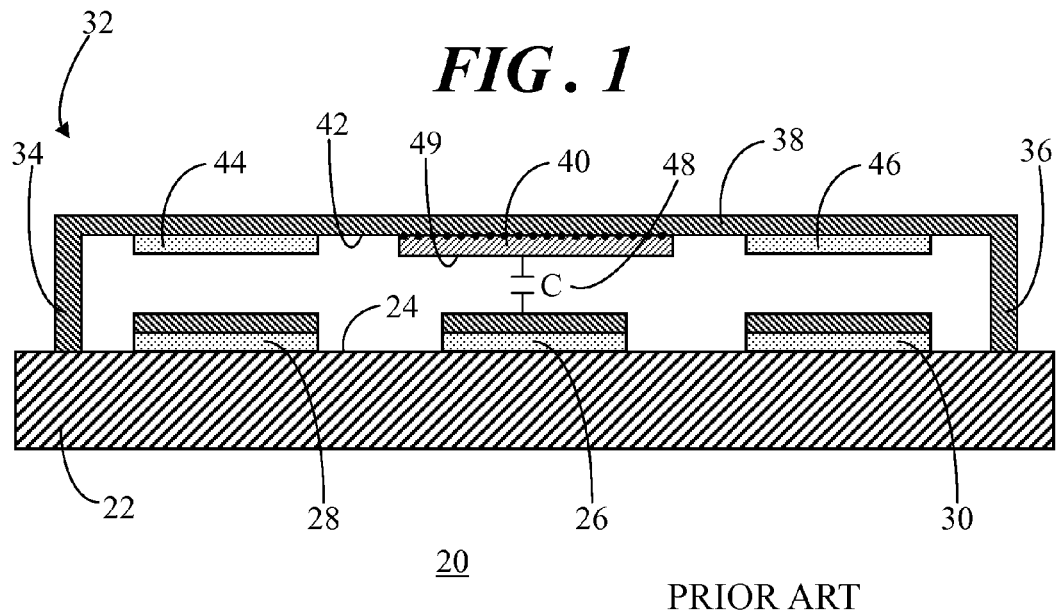
FIG. 1 shows a side view of a prior art MEMS capacitive device formed using a single substrate surface micromachining process.
Figure 2:
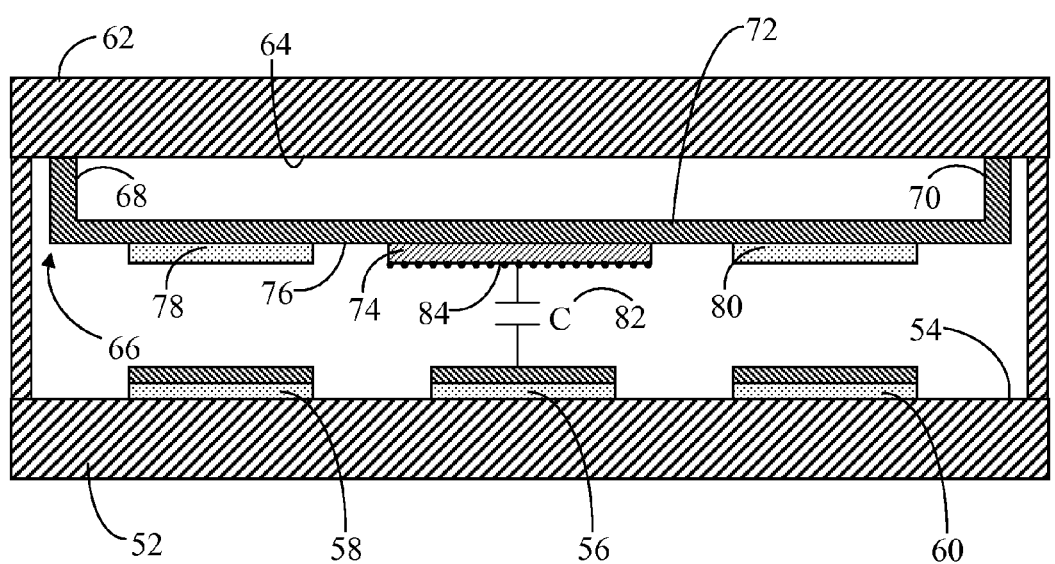
FIG. 2 shows a side view of a prior art MEMS capacitive device formed using surface micromachining and substrate bonding processes.
Figure 3:
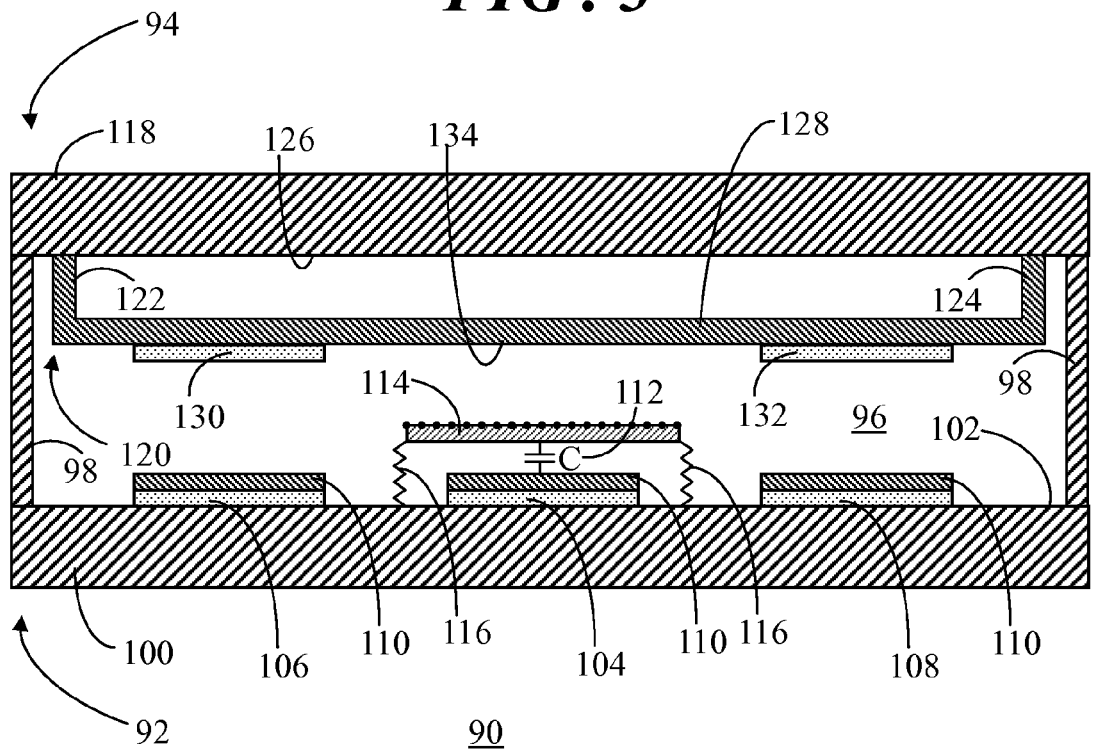
FIG. 3 shows a side view of a MEMS capacitive device in accordance with an embodiment of the invention.

FIG. 3 shows a side view of a portion of a piezoelectric MEMS capacitor or capacitive device 90 in accordance with one embodiment. Capacitive device 90 includes a substrate structure 92 and a substrate structure 94, each of which form a portion of capacitive device 90. Substrate structure 94 is coupled with substrate structure 92 to form a volume 96 between substrate structures 92 and 94. Coupling of substrate structure 94 and substrate structure 92 may be achieved through application of a bonding interface 98 which may be metallic bond rings, glass frit, metal eutectic, compression, and the like to form a hermetically sealed joint surrounding volume 96. Materials that may be utilized for bonding interface include, for example, gold, indium, aluminum, copper, silver, alloys thereof, and compounds thereof.

Substrate structure 92 includes a substrate 100 having a surface 102. A fixed capacitor plate 104 and a pair of electrostatic actuators 106 and 108, arranged on opposing sides of fixed capacitor plate 104, are formed on surface 102. In the illustrated embodiment, substrate structure 92 of capacitive device 90 includes two electrostatic actuators 106 and 108, positioned on opposing sides of and approximately equidistant from fixed capacitor plate 104. In alternate embodiments, zero, one, or more than two fixed electrostatic actuators may be formed on surface 102 of substrate 100.

In an embodiment, a suitable dielectric or dielectric stack 110 may be formed overlying at least a portion of fixed capacitor plate 104 and each of electrostatic actuators 106 and 108. The coverage and material composition of dielectric 110 overlying fixed capacitor plate 104 includes at least a minimum sufficient coverage and material composition to produce a desired value of a capacitance 112 of MEMS capacitive device 90.

Substrate structure 92 further includes a movable capacitor plate 114 positioned in spaced apart relationship above fixed capacitor plate 104. In an embodiment, movable capacitor plate 114 includes a metal only conductive material. Springs or compliant members 116 interconnect movable capacitor plate 114 with surface 102 of substrate 100. Compliant members 116 enable motion of movable capacitor plate 114 toward fixed capacitor plate 104. Any suitable configuration, quantity, and mechanical stiffness of compliant members 116 may be employed to obtain the desired tuned response.

Substrate structure 94 includes another substrate 118. A movable element 120 includes fixed ends 122 and 124 coupled to a surface 126 of substrate 118. A flexible intermediate section 128 of movable element 120 spans between 122 and 124. Flexible section 128 is suspended above surface 126 and is arranged generally parallel to a plane of movable capacitor plate 114, but is spaced apart from movable capacitor plate 114. Piezoelectric actuators 130 and 132 are formed on an outer surface 134 of intermediate section 128. Per convention, piezoelectric actuators 130 and 132 each include a lower electrode layer, a piezoelectric material layer, and an upper electrode layer, not distinguished herein for clarity.

It should be noted that fixed capacitor plate 104, actuators 106, 108, movable capacitor plate 114, movable element 120, and piezoelectric actuators 130 and 132 are all located within volume 96 formed by coupling second substrate structure 94 with first substrate structure 92. In addition, actuator 130 faces actuator 106. Likewise, actuator 132 faces actuator 108. However, the vertical or stacked configuration of capacitive device 90 and fabrication methodology (discussed below) results in piezoelectric actuators 130 and 132 being formed at a different layer than movable capacitor plate 114.

Figure 4:
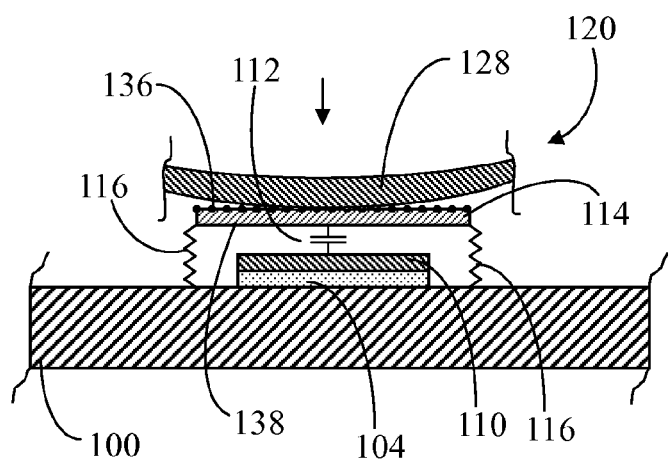
FIG. 4 shows a partial side view of the MEMS capacitive device of FIG. 3 in an actuated state.

FIG. 4 shows a partial side view of MEMS capacitive device 90 in an actuated state. To produce the actuated state, an appropriate force, or voltage, applied across piezoelectric actuators 130 and 132 (FIG. 3) will result in deformation of the flexible intermediate section 128 of movable element 120 toward movable capacitor plate 114. Movement of intermediate section 128 causes abutment of outer surface 134 of intermediate section 128 against a back surface 136 of movable capacitor plate 114. This abutment of intermediate section 128 with back surface 136 of movable capacitor plate 114 moves an opposing surface 138 of capacitor plate 114 toward fixed capacitive plate 104 due to the presence of compliant members 116 from which movable capacitor plate 114 is suspended. This movement, in turn, alters or otherwise forms capacitance 112.

In an embodiment, piezoelectric actuators 130 and 132 are formed at particular locations on intermediate section 128 so that when MEMS capacitive device (FIG. 3) is actuated and intermediate section 128 is in abutment with contact surface 136 of movable capacitor plate 114, actuators 130 and 132 are located approximately equidistant from and on opposing sides of movable capacitor plate 114. This configuration can result in a substantially constant force being applied against the surface area of contact surface 136 by the abutment of intermediate portion 128.

In an embodiment, movable element 120 is a bridge structure having two fixed ends 122 and 124 with flexible section 128 spanning between them and suspended above surface 126 of substrate 118. In an alternative embodiment, a movable element may be a cantilevered structure having a single fixed end with a flexible section extending from the fixed end that is generally parallel to but spaced apart from movable capacitor plate 114.

Actuators 130 and 132 are discussed as being piezoelectric actuators. When piezoelectric actuators 130 and 132 are implemented, actuators 106 and 108 need not be present on surface 102 of substrate 100. In alternative embodiments, actuators 130 and 132 may be electrostatic actuators, or electrostatic actuator electrodes. Thus, to produce the actuated state, an appropriate voltage difference may be generated between actuators 106 and 130 (FIG. 3) and similarly between actuators 108 and 132 (FIG. 3) in order to affect deformation of flexible intermediate portion 128. In still other embodiments, actuators 130 and 132 may include some combination of a piezoelectric portion and an electrostatic portion. Other actuation methods (e.g., thermal, magnetic, and so forth, or combinations thereof) may also be used with the appropriate selection of actuators 130, 132 and/or actuators 106, 108.

MEMS capacitive device 90 is fabricated as a dual substrate structure, sometimes referred to as a wafer capping or a three-dimensional architecture, with piezoelectric actuators 130 and 132 being fabricated separate from capacitor plates 104 and 114. Thus, the problems discussed above of thermal and stress mismatch are alleviated. In addition, MEMS capacitive device 90 is fabricated using a build-up technique, such as surface micromachining, as will be discussed in significantly greater detail below. Accordingly, fabrication of substrate structure 92 results in back surface 136 being the "top" surface characterized by a surface roughness that is rougher than opposing surface 138 of movable capacitor plate 114. As such, the adverse effect of contact surface roughness is additionally alleviated so as to achieve acceptable process tolerance while concurrently achieving successful device reproducibility in mass production.

Figure 5:
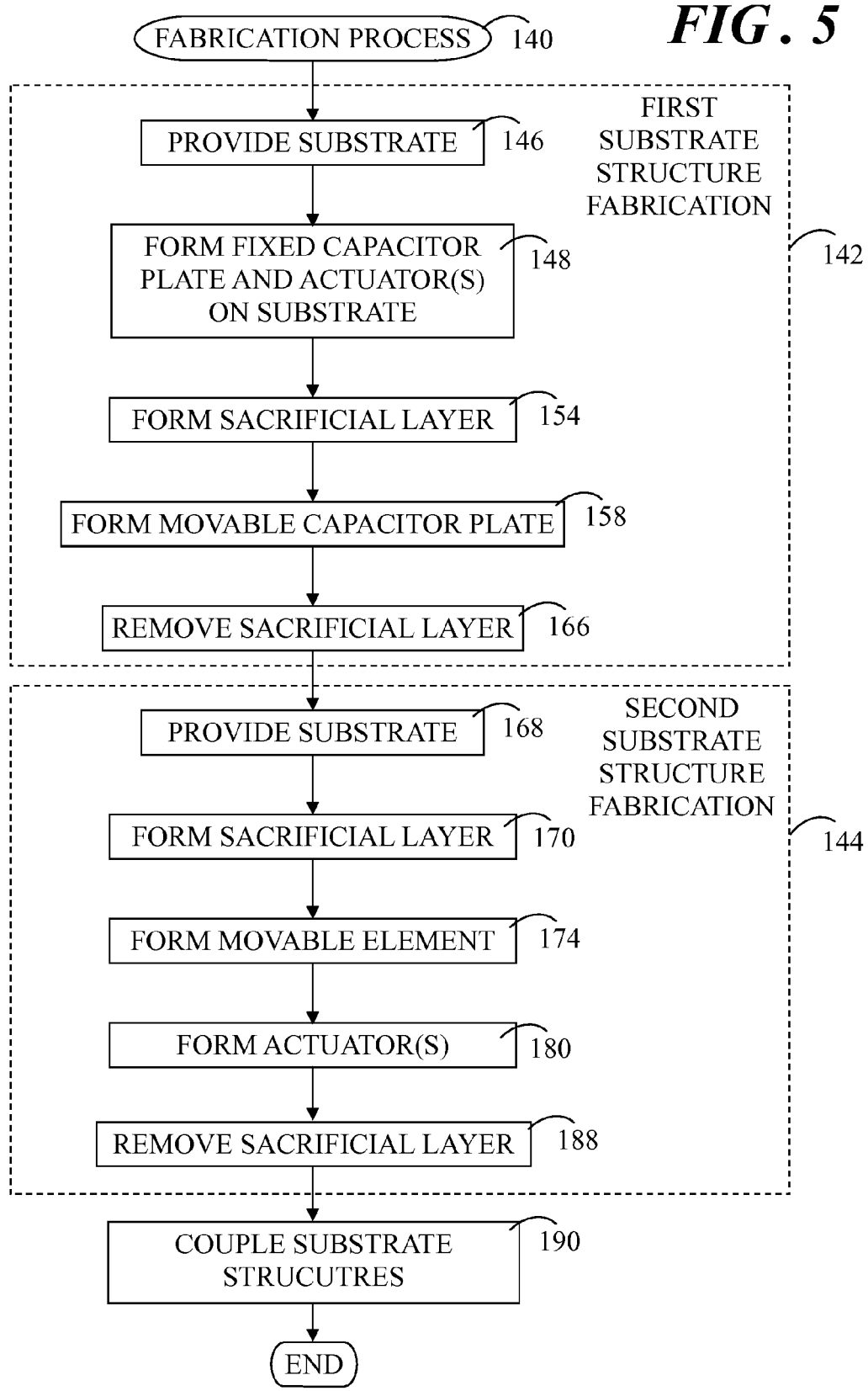
FIG. 5 shows a flowchart of a fabrication process for fabricating the MEMS capacitive device of FIG. 3.

FIG. 5 shows a flowchart of a fabrication process 140 for fabricating MEMS capacitive device 90. In accordance with an embodiment, first substrate structure 92 is fabricated separately from the fabrication of second substrate structure 94. This is represented in FIG. 5 by a dashed box delineating a first substrate structure fabrication subprocess 142 and another dashed box delineating a second substrate structure fabrication subprocess 144. The operations of fabrication process 140 will be discussed in connection with FIGS. 6-16. As such, throughout discussion of the operations of fabrication process 140, reference will be made to particular ones of FIGS. 6-16.

Subprocesses 142 and 144 are discussed herein as occurring in a serial fashion. However, it should be readily apparent that subprocesses 142 and 144 could be executed currently on different machinery within a manufacturing facility. Alternatively, subprocesses 142 and 144 could be executed at different manufacturing facilities at different times, and the resulting first and second substrate structures 92 and 94 (FIG. 3) could be provided to one of the manufacturing facilities or to a third manufacturing facility for coupling, testing, packaging, and the like.

Fabrication process 140 is described below in connection with the fabrication of a single MEMS capacitive device 90. However, it should be understood by those skilled in the art that the following process allows for concurrent wafer-level manufacturing of a plurality of MEMS capacitive devices 90. The individual MEMS capacitive devices 90 can then be cut, or diced, in a conventional manner to provide individual MEMS capacitive devices 90 that are hermetically packaged.

First substrate structure fabrication subprocess 142 of process 140 begins with a task 146. At task 146, substrate 100 (FIG. 3) is provided. As known to those skilled in the art, a substrate is typically a thin (approximately one half of a millimeter) disk and can comprise any semiconductor material or combination of semiconductor materials, such as gallium arsenide, gallium nitride, silicon germanium, silicon-on-insulator (SOI), silicon, monocrystalline silicon, glass, ceramic, or the like, and combinations of the above. Alternatively, substrate 100 could contain integrated circuits or active devices, such as complementary metal-oxide-semiconductor (CMOS) devices, bi-polar CMOS devices, and so forth. In an embodiment, fabrication process 140 employs a surface micromachining technique based on the deposition and etching of different structural layers. As such, the elements of MEMS capacitive device 90 are built on top of substrates 100 and 118 (FIG. 3) and not inside them (such as in bulk micromachining). Consequently, the substrates' properties are not as critical. As such, substrate 100 may be formed from lower cost semiconductor materials.

Subprocess 142 continues with a task 148. At task 148, fixed capacitive plate 104 (FIG. 3) and actuators 106 and 108 (FIG. 3) are formed on surface 102 (FIG. 3) of substrate 100.

Figure 6:
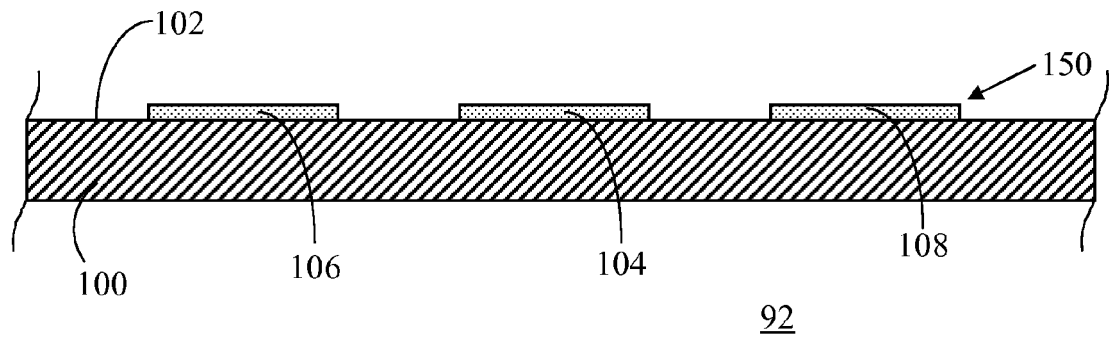
FIG. 6 shows a side view of a substrate structure of the MEMS capacitive device of FIG. 3 at an initial stage of processing.
Figure 7:
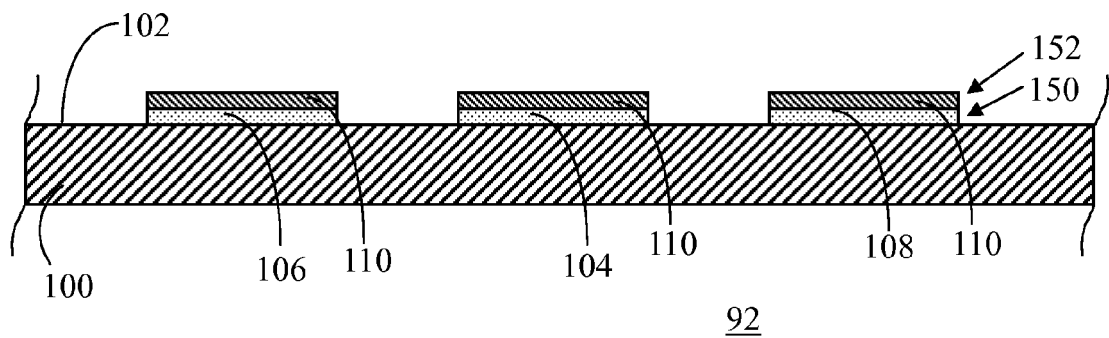
FIG. 7 shows a side view of the substrate structure of FIG. 6 further along in processing.

Referring to FIGS. 6 and 7 in connection with task 148, FIG. 6 shows a side view of substrate structure 92 of the MEMS capacitive device 90 (FIG. 3) at an initial stage of processing, and FIG. 7 shows a side view of substrate structure 92 of FIG. 6 further along in processing. As shown in FIG. 6, a material layer 150 is deposited on surface 102 of substrate 100. Material layer 150 may be deposited, patterned, and etched in accordance with conventional surface micromachining techniques to form fixed capacitive plate 104 and actuators 106 and 108 that are electrically isolated from fixed capacitive plate 104. The material composition and dimensions of fixed capacitive plate 104 and actuators 106 and 108 are selected according to the capacitance value requirements of a given MEMS capacitive device 90 (FIG. 3) and its application.

As shown in FIG. 7, an electrically insulating dielectric material layer 152 is deposited over material layer 150. Dielectric material layer 152 may be may be any suitable dielectric, for example, silicon nitride (SiN). Dielectric material layer 152 may be deposited, patterned, and etched in accordance with conventional surface micromachining techniques to form dielectric 110 overlying fixed capacitor plate 104 and actuators 106 and 108. Although, not shown, dielectric 110 may additionally overlie a portion of surface 102 of substrate 100. Dielectric 110 serves as a high permittivity intervening medium between stored positive and negative charges on capacitor plates 104 and 114. Dielectric 110 can prevent the conductive capacitor plates 104 and 114 from coming into direct electrical contact. In addition, a high permittivity allows for a greater charge to be stored in MEMS capacitive device 90 at a given voltage.

Figure 8:
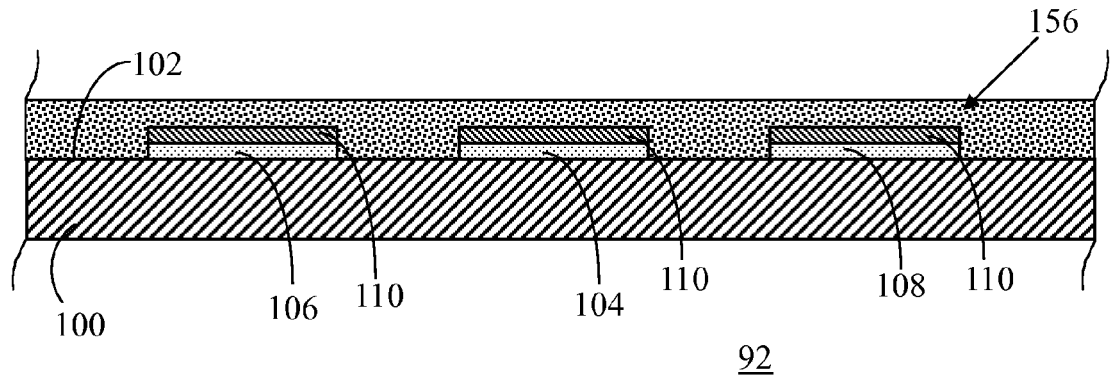
FIG. 8 shows a side view of the substrate structure of FIG. 7 further along in processing.

Referring back to first substrate structure subprocess 142 (FIG. 5), following task 148 subprocess 142 continues with a task 154. At task 154, a sacrificial layer is formed. Referring to FIG. 8 in connection with task 154, FIG. 8 shows a side view of substrate structure 92 of FIG. 7 further along in processing. A sacrificial layer 156 is deposited over dielectric 110 of fixed capacitor plate 104 and actuators 106 and 108, as well as over the exposed surface 102 of substrate 100.

With reference back to FIG. 5, following the deposition of sacrificial layer 156 (FIG. 8) at task 154, subprocess 142 of fabrication process 140 continues with a task 158. At task 158, movable capacitor plate 114 (FIG. 3) is formed overlying fixed capacitor plate 104 (FIG. 3) and interconnected with surface 102 (FIG. 3) of substrate 100 via compliant members 116 (FIG. 3).

Figure 9:
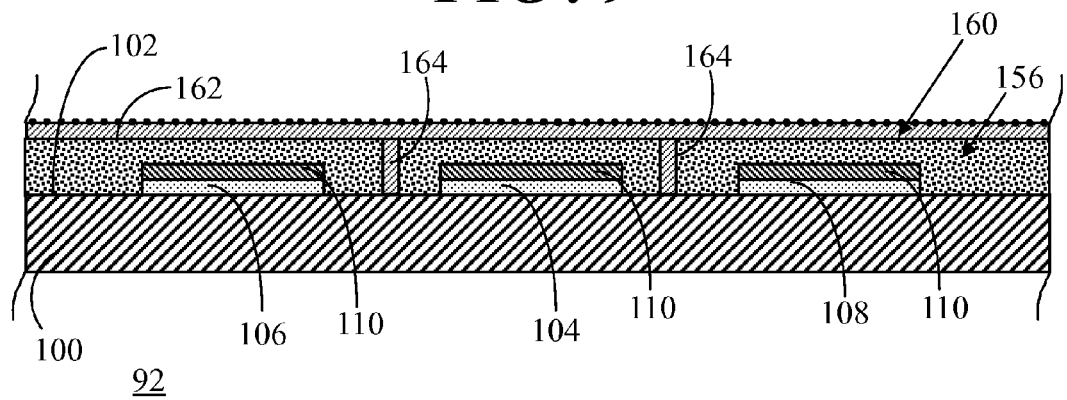
FIG. 9 shows a side view of the substrate structure of FIG. 8 further along in processing.

Referring to FIG. 9 in connection with task 158, FIG. 9 shows a side view of substrate structure 92 of FIG. 8 further along in processing. As illustrated in FIG. 9, an electrically conductive material layer 160 is deposited over a top surface 162 of sacrificial layer 156. Conductive material layer 160 may be any suitable electrically conductive material. In an embodiment, conductive material layer 160 is a metal only material such as copper, gold, aluminum, alloys of copper, alloys of gold, and the like.

As further illustrated in FIG. 9, anchor elements 164 of compliant members 116 are formed extending through sacrificial layer 156 and coupling with surface 102 of substrate 100. In an embodiment, anchor elements 164 may be formed by producing vias through sacrificial layer between surface 102 of substrate 100 and top surface 162 of sacrificial layer 160. Conventional semiconductor processes may be employed to form the vias. The vias are subsequently filled with a material to form anchor elements 164 that interconnect compliant members 116 with surface 102 of substrate 100. By way of example, the vias may be filled when conductive material layer 160 is deposited on top surface 162 of sacrificial layer 160. Alternatively, the vias may be filled with any suitable material in a separate process step prior to deposition of conductive material layer 160. Following formation of anchor elements 164 and the deposition of conductive material layer 160, layer 160 is patterned and etched to produce movable capacitor plate 114 (FIG. 3).

Figure 10:
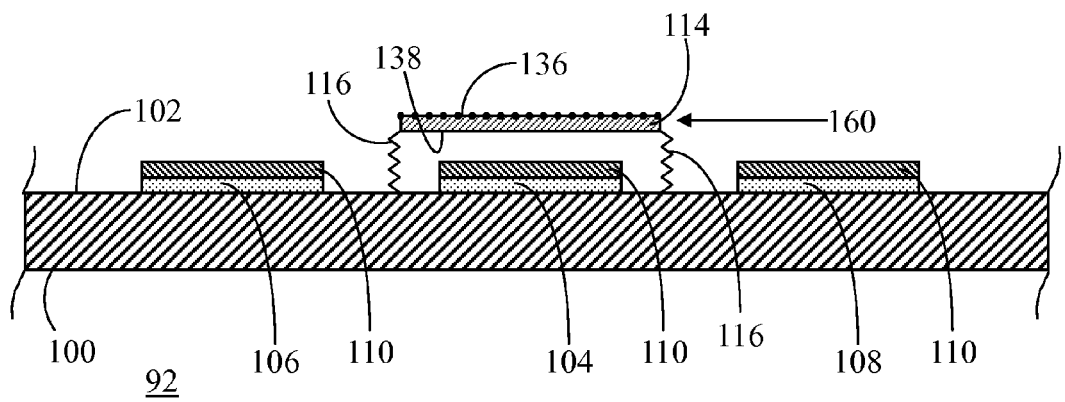
FIG. 10 shows a side view of the substrate structure of FIG. 9 further along in processing.
Figure 11:
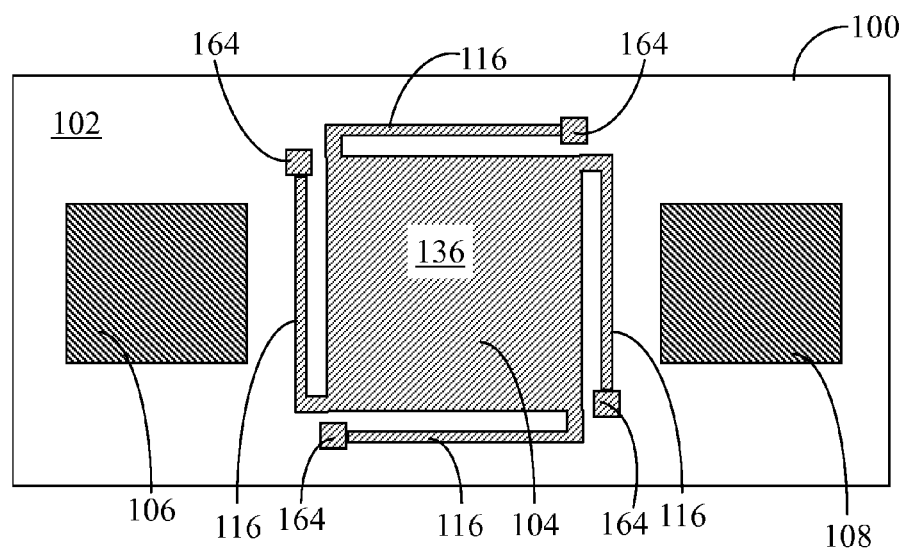
FIG. 11 shows a top view of the substrate structure following processing.

Referring back to first substrate structure fabrication subprocess 142 (FIG. 5), following the formation of movable capacitor plate 114 at task 158, subprocess 142 continues with a task 166. At task 166, sacrificial layer 156 (FIG. 9) is removed. Referring to FIGS. 10 and 11 in connection with task 166, FIG. 10 shows a side view of substrate structure 92 of FIG. 9 further along in processing, and FIG. 11 shows a top view of substrate structure 92 following processing.

As shown, electrically conductive material layer 160 has been patterned and etched to form movable capacitor plate 114. Sacrificial layer 156 (FIG. 9) may then be removed utilizing, for example, an etching process. Following removal of sacrificial layer 156, movable capacitor plate 114 is suspended over fixed capacitor plate 104 via compliant members 116, which are coupled to surface 102 of substrate 100 by anchor elements 164. In addition, the relatively rough contact surface 136 is a top, or outer, surface of movable capacitor plate 114. Whereas, removal of sacrificial layer 156 from underneath movable capacitor plate 114 forms the relatively smoother surface 138 of capacitor plate 114. Removal of sacrificial layer 156 as exposes fixed capacitor plate 104 and actuators 106 and 108.

Those skilled in the art will recognize that substrate structure 92 may include traces, contacts, electrical interconnections for connection to external components, and the like not shown herein for simplicity of illustration. These traces, contacts, electrical interconnections, and the like can be formed utilizing surface micromachining of additional structural layers and/or in the structural layers discussed herein. It should be further understood, that a surface micromachining process can include the deposition, planarization, patterning, and etching of additional layers such as a buffer layer, an insulating barrier layer, and so forth not discussed herein for brevity.

Returning back to fabrication process 140 of FIG. 5, following task 166, the fabrication of substrate structure 92 (FIG. 11) through the execution of first substrate structure fabrication subprocess 142 is complete. In the illustrative embodiment of FIG. 5, fabrication process 140 continues with operations associated with second substrate structure fabrication subprocess 144. Again, the serial arrangement of subprocesses 142 and 144 is presented for purposes of explanation. It should be recalled, however, that there is no requirement that first substrate structure fabrication subprocess 142 and second substrate structure fabrication subprocess 144 are to be executed in a serial manner, or that subprocess 142 should be performed prior to subprocess 144.

Second substrate structure fabrication subprocess 142 begins with a task 168. At task 168, substrate 118 (FIG. 3) of second substrate structure 94 is provided. Substrate 118 can comprise any semiconductor material or combination of semiconductor materials, such as gallium arsenide, gallium nitride, silicon germanium, silicon-on-insulator (SOI), silicon, monocrystalline silicon, glass, ceramic, or the like, and combinations of the above. Alternatively, substrate 118 could contain integrated circuits or active devices, such as CMOS devices, bi-polar CMOS devices, and so forth.

Figure 12:
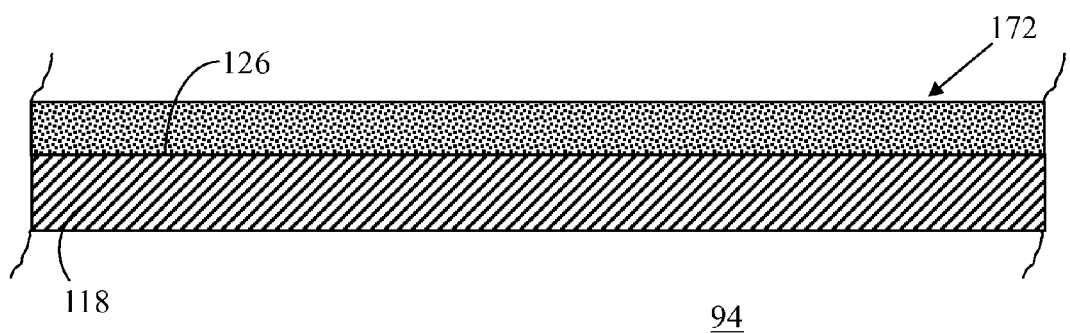
FIG. 12 shows a side view of another substrate structure of the MEMS capacitive device of FIG. 3 at an initial stage of processing.

Following task 168, a task 170 is performed. At task 170, a sacrificial layer is formed on substrate 118. Referring to FIG. 12 in connection with task 170, FIG. 12 shows a side view of substrate structure 94 of MEMS capacitive device 90 (FIG. 3) at an initial stage of processing. A sacrificial layer 172 is deposited over surface 126 of substrate 118. Again, it should be understood that one or more intervening layers (not shown) may have been previously formed between sacrificial layer 172 and surface 126, such as a buffer layer or insulating layer known to those skilled in the art.

Returning back to second substrate structure fabrication subprocess 144 (FIG. 5). Following task 170, a task 174 is performed. At task 174, movable element 120 is formed over sacrificial layer 172.

Figure 13:
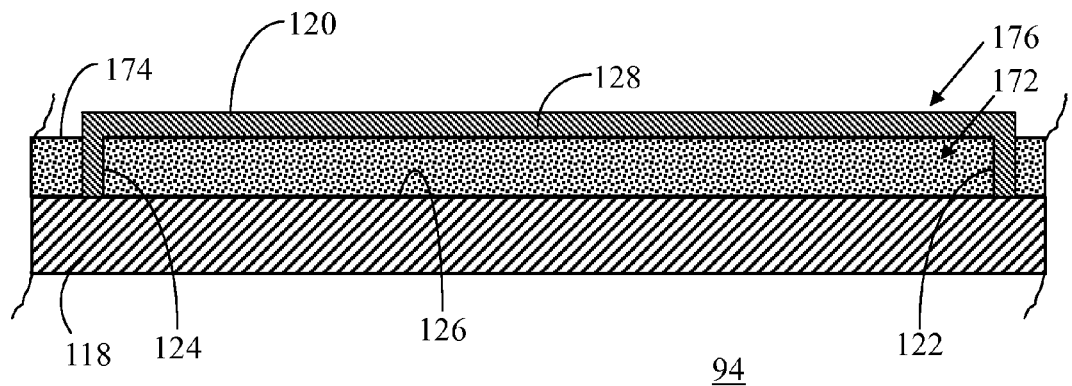
FIG. 13 shows a side view of the substrate structure of FIG. 12 further along in processing.

Referring to FIG. 13 in connection with task 174, FIG. 13 shows a side view of substrate structure 94 of FIG. 12 further along in processing. As illustrated in FIG. 13, a dielectric material layer 176 is deposited over a top surface 178 of sacrificial layer 172. Dielectric material layer 176 may be any appropriate nonconductive material.

As further illustrated in FIG. 13, first and second ends 122 and 124, respectively, of movable element 120 are formed extending through sacrificial layer 172 and coupling with surface 126 of substrate 118. In an embodiment, first and second ends 122 and 124 may be formed by producing vias through sacrificial layer 172 between surface 126 of substrate 118 and top surface 178 of sacrificial layer 172. Conventional semiconductor processes may be employed to form the vias. The vias are subsequently filled with a material to form first and second ends 122 and 124 that interconnect intermediate section 128 of movable element 120 with surface 126 of substrate 118. By way of example, the vias may be filled when material layer 176 is deposited on top surface 178 of sacrificial layer 172. Alternatively, the vias may be filled with any suitable material in a separate process step prior to deposition of material layer 176.

Following formation of first and second ends 122 and 124 and the deposition of material layer 176, layer 176 is patterned and etched to produce movable element 120 that include intermediate section 128. Material layer 176 is deposited at an appropriate thickness so that intermediate section 128 is flexible following removal of sacrificial layer 172. The flexibility of intermediate section 128 enables its movement into abutment with contact surface 136 (FIG. 4) during actuation of MEMS capacitive device 90, as discussed above in connection with FIG. 4.

Returning back to second substrate structure fabrication subprocess 144 (FIG. 5). Following task 174, a task 180 is performed. At task 180, piezoelectric actuators 130 and 132 are formed on outer surface 134 of intermediate section 128.

Figure 14:
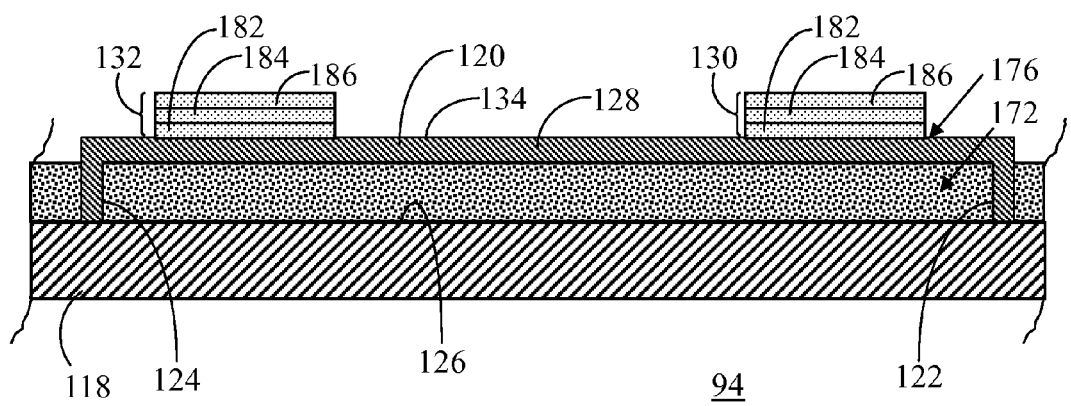
FIG. 14 shows a side view of the substrate structure of FIG. 13 further along in processing.

Referring to FIG. 14 in connection with task 180, FIG. 14 shows a side view of substrate structure 94 of FIG. 13 further along in processing. Formation of piezoelectric actuators 130 and 132 can entail the deposition, patterning, and etching of a material layer to form a lower electrode layer 182 on outer surface 134 of intermediate section 128. Next, a piezoelectric material layer 184 may be formed over lower electrode layer 182. An upper electrode layer 186 is subsequently formed over the piezoelectric material layer 184. Thus, each of piezoelectric actuators 130 and 132 may be formed as a three-layered structural piezoelectric element using semiconductor fabrication processes for piezoelectric materials that can include a high temperature annealing process.

Piezoelectric actuators 130 and 132 are fabricated on movable element 120 of substrate structure 94. Furthermore, fixed capacitor plate 104 and the metal only movable capacitor plate 114 are formed separately as substrate structure 92 (FIG. 3). Substrate structure 94 is subsequently coupled with substrate structure 92. This allows more independent thermal, mechanical, and electrical design and fabrication of capacitor plates 104 and 114 from piezoelectric actuators 130 and 132, thereby mitigating problems associated with stress and thermal mismatch.

Returning back to second substrate structure fabrication subprocess 144 (FIG. 5). Following task 180, following the formation of piezoelectric actuators at task 180, subprocess 144 continues with a task 188. At task 188, sacrificial layer 172 (FIG. 14) is removed.

Figure 15:
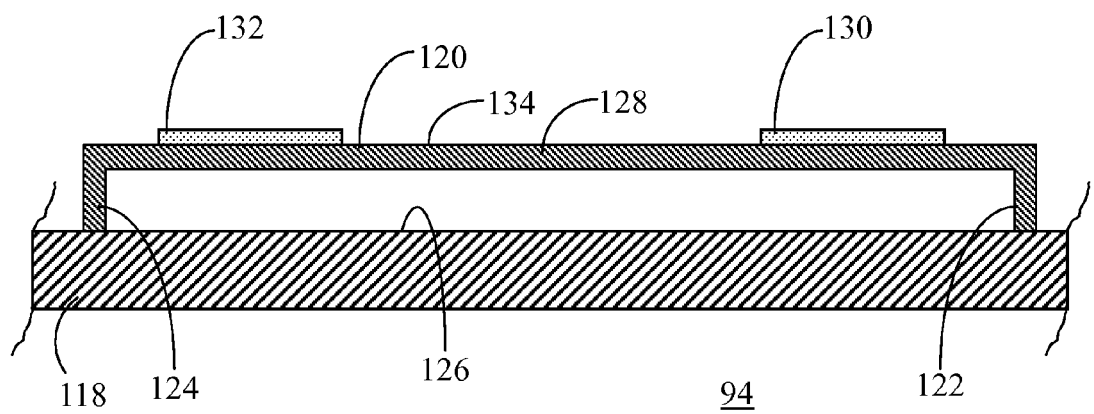
FIG. 15 shows a side view of the substrate structure of FIG. 14 further along in processing.
Figure 16:
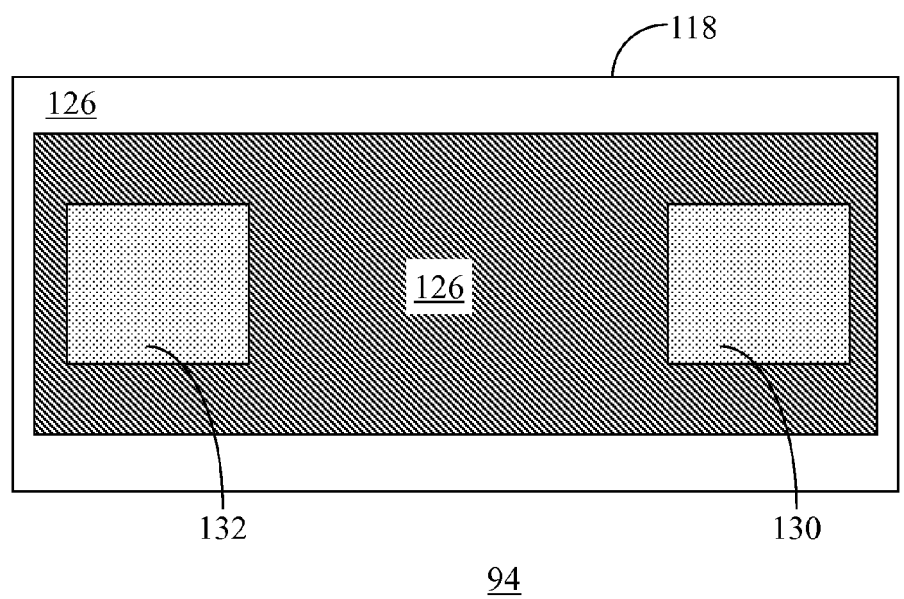
FIG. 16 shows a top view of the substrate structure of FIG. 15 following processing.

Referring to FIGS. 15 and 16 in connection with task 188, FIG. 15 shows a side view of substrate structure 94 of FIG. 14 further along in processing, and FIG. 16 shows a top view of substrate structure 94 following processing. As shown, movable element 120 and actuators 130 and 132 have been formed and sacrificial layer 172 has been removed utilizing, for example, an etching process. Following removal of sacrificial layer 172, the flexible intermediate section 128 of movable element 120 is suspended over substrate 118 via first and second ends 122 and 124, respectively, which are coupled to surface 126 of substrate 118.

Those skilled in the art will recognize that substrate structure 94 may include traces, contacts, electrical interconnections for connection to external components, and the like not shown herein for simplicity of illustration. These traces, contacts, electrical interconnections, and the like can be formed utilizing surface micromachining of additional structural layers and/or in the structural layers discussed herein. It should be further understood, that a surface micromachining process can include the deposition, planarization, patterning, and etching of additional layers such as a buffer layer, an insulating barrier layer, and so forth not discussed herein for brevity.

Returning back to fabrication process 140 of FIG. 5, following task 188, the fabrication of substrate structure 94 (FIG. 16) through the execution of second substrate structure fabrication subprocess 144 is complete. Accordingly, fabrication process 140 continues with a task 190.

At task 190, substrate structure 94 is coupled with substrate structure 92. Referring to FIG. 3 in connection with task 190, in an embodiment, coupling may entail the singulation or dicing of substrate 118 to provide a plurality of individual substrate structures 94. These individual substrate structures 84 may then be picked, flipped over, and placed into tape reels suitable for automated assembly. Next, the individual substrate structures 94 may then be coupled at appropriate locations on substrate 100 containing a plurality of substrate structures 92. That is, bonding interface 98 may be formed between each of substrate structures 94 and substrate structures 92. Following the coupling of substrate structures 94 with substrate structures 92, the underlying substrate 100 may be diced, or sawn, to yield a plurality of MEMS capacitive devices. Fabrication process 140 ends following task 190. Of course, additional known processes may be performed subsequent to task 190 such as, for example, testing, wafer thinning, packaging, and so forth to form the plurality of separate MEMS capacitive devices 90.

Figure 17:
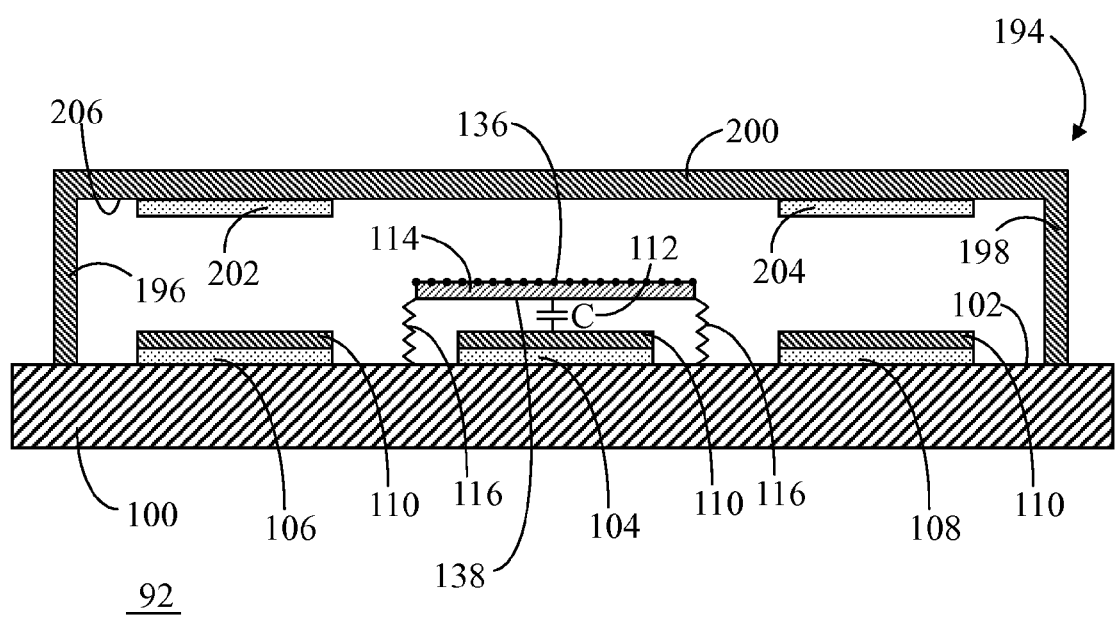
FIG. 17 shows a side view of a MEMS capacitive device in accordance with another embodiment of the invention.

FIG. 17 shows a side view of a MEMS capacitive device 192 in accordance with another embodiment of the invention. MEMS capacitive device 192 is a single substrate configuration. However, device 192 retains the feature of a movable element that is physically separate, i.e., physically detached and distinct, from the fixed and movable capacitor plates. Those elements of MEMS capacitive device 192 that are common with corresponding elements of MEMS device 90 are referred to below by the same reference numerals for simplicity of discussion.

MEMS capacitive device 192 includes fixed capacitor plate 104 and actuators 106 and 108 formed on surface 102 of substrate 100. Dielectric 110 may be formed overlying at least a portion of fixed capacitor plate 104 and each of actuators 106 and 108. Movable capacitor plate 114 is positioned in spaced apart relationship above fixed capacitor plate 104, with compliant members 116 interconnecting movable capacitor plate 114 to surface 102 of substrate 100.

MEMS capacitive device 192 further includes a movable element 194 that is physically separate, i.e., physically detached and distinct, from capacitor plates 104 and 114. That is, movable element 194 includes fixed ends 196 and 198 coupled to surface 102 of substrate 100. A flexible intermediate section 200 of movable element 194 spans between fixed ends 196 and 198. Actuators 202 and 204 are formed on an inner surface 206 of flexible section 200. In response to actuation of actuators 106, 108 and/or actuators 202,204, flexible section 200 flexes toward surface 102 to abut contact surface 136 of movable capacitor plate 114 causing capacitor plate 114 to move toward fixed capacitor plate 104 to alter capacitance 112.

Movable element 194 with actuators 202 and 204 may be formed using surface micromachining techniques to build up layers and selectively remove sacrificial layers until the illustrated structure is formed. Like MEMS capacitive device 90, the build up fabrication methodology of MEMS capacitive device 192 results in surface 136 being rougher than surface 138. As such, the adverse effect of contact surface roughness can be alleviated. The single substrate configuration may be useful in applications in which acceptable process tolerance and reproducibility are still required, even though actuators 202 and 204 need not be piezoelectric actuators.

Embodiments of the invention entail microelectromechanical systems (MEMS) capacitive devices having separate actuators and capacitor plates. Processing methodology calls for fabricating the MEMS capacitive device using surface micromachining and substrate bonding processes to produce in one embodiment a three-dimensional stacked architecture. A MEMS capacitive device includes one or more piezoelectric actuators formed on a movable element on one substrate and the fixed and movable capacitor plates of a parallel plate capacitor formed on another substrate. Alternatively, a MEMS capacitive device includes fixed and movable capacitor plates of a parallel plate capacitor formed on a substrate, and a movable element that is physically separate from the fixed and movable capacitor plates also formed on the substrate, with one or more actuators formed on the movable element. The MEMS capacitive devices and fabrication methodology mitigates problems associated with stress and thermal mismatch, contact surface roughness, and so forth to achieve acceptable process tolerance while concurrently achieving successful device reproducibility in mass production.

Although the preferred embodiments of the invention have been illustrated and described in detail, it will be readily apparent to those skilled in the art that various modifications may be made therein without departing from the spirit of the invention or from the scope of the appended claims. By way of example, the capacitor plates and actuators illustrated herein can take on various shapes and sizes in accordance with capacitor design requirements.

What is claimed is:

1. A capacitive device comprising:
   a fixed capacitor plate formed on a surface of a substrate;
   a movable capacitor plate positioned in spaced apart relationship above said fixed capacitor plate;
   a compliant member interconnecting said movable capacitor plate with said surface, said compliant member enabling motion of said movable capacitor plate toward said fixed capacitor plate;
   a movable element positioned in spaced apart relationship from said movable capacitor plate; and
   a piezoelectric actuator formed on said movable element for moving said movable element into abutment with said movable capacitor plate in response to a force applied at said actuator, said abutment moving said movable capacitor plate toward said fixed capacitor plate to alter a capacitance between said movable and fixed capacitor plates.

2. A capacitive device as claimed in claim 1 wherein:
   said movable capacitor plate is formed at a first structural layer; and
   said piezoelectric actuator is formed at a second structural layer, said second structural layer differing from said first structural layer.

3. A capacitive device as claimed in claim 1 wherein said substrate is a first substrate, and said capacitive device further comprises a second substrate coupled with said first substrate, said second substrate having a second surface facing said first surface of said first substrate, and said movable element is formed on said second surface.

4. A capacitive device as claimed in claim 1 wherein said movable element is formed on said first surface of said substrate and is physically separate from said movable capacitor plate on said first surface.

5. A capacitive device as claimed in claim 1 wherein said movable element comprises:
   a fixed end; and
   a flexible section extending from said fixed end, said flexible section being positioned in spaced apart relationship above said movable capacitor plate.

6. A capacitive device comprising:
   a fixed capacitor plate formed on a surface of a substrate;
   a movable capacitor plate positioned in spaced apart relationship above said fixed capacitor plate;
   a compliant member interconnecting said movable capacitor plate with said surface, said compliant member enabling motion of said movable capacitor plate toward said fixed capacitor plate;
   a movable element positioned in spaced apart relationship from said movable capacitor plate;
   a first actuator formed on said movable element for moving said movable element into abutment with said movable capacitor plate in response to a force applied at said actuator, said abutment moving said movable capacitor plate toward said fixed capacitor plate to alter a capacitance between said movable and fixed capacitor plates; and
   a second actuator formed on said movable element, said first and second actuators being located approximately equidistant from and on opposing sides of said movable capacitor plate when said movable element abuts said movable capacitor plate.

7. A capacitive device comprising:
   a fixed capacitor plate formed on a surface of a substrate;
   a movable capacitor plate positioned in spaced apart relationship above said fixed capacitor plate;
   a compliant member interconnecting said movable capacitor plate with said surface, said compliant member enabling motion of said movable capacitor plate toward said fixed capacitor plate;
   a movable element positioned in spaced apart relationship from said movable capacitor plate;
   a first actuator formed on said movable element for moving said movable element into abutment with said movable capacitor plate in response to a force applied at said first actuator, said abutment moving said movable capacitor plate toward said fixed capacitor plate to alter a capacitance between said movable and fixed capacitor plates; and
   a second actuator formed on said first surface of said substrate, said second actuator facing said first actuator.

8. A capacitive device as claimed in claim 7 further comprising:
   a third actuator formed on said movable element; and
   a fourth actuator formed on said first surface, said fourth actuator facing said third actuator.

9. A capacitive device comprising:
   a fixed capacitor plate formed on a surface of a substrate;
   a movable capacitor plate positioned in spaced apart relationship above said fixed capacitor plate;
   a compliant member interconnecting said movable capacitor plate with said surface, said compliant member enabling motion of said movable capacitor plate toward said fixed capacitor plate; and
   a movable element positioned in spaced apart relationship from said movable capacitor plate, said movable element being actuated to cause abutment of said movable element against said movable capacitor plate, said abutment moving said movable capacitor plate toward said fixed capacitor plate to alter a capacitance between said movable and fixed capacitor plates, said movable element comprising:
a first fixed end;
a second fixed end; and
a flexible section coupled to and spanning between said first and second fixed ends, said flexible section being positioned in spaced apart relationship above said movable capacitor plate.

10. A method of fabricating a capacitive device comprising:
providing a substrate;
forming a material layer on a first surface of said substrate to include a fixed capacitor plate;
following said forming said material layer, forming a sacrificial layer on said first material layer;
forming a movable capacitor plate on said sacrificial layer and interconnected with said first surface via a compliant member;
removing said sacrificial layer following said forming said movable capacitor plate such that said movable capacitor plate is positioned in spaced apart relationship above said fixed capacitor plate and said compliant member enables motion of said movable capacitor plate toward said fixed capacitor plate; and
forming a movable element positioned in spaced apart relationship from said movable capacitor plate, and physically separate from said movable capacitor plate, said movable element adapted to be actuated to cause abutment of said movable element against said movable capacitor plate, said abutment moving said movable capacitor plate toward said fixed capacitor plate to alter a capacitance between said movable and fixed capacitor plates.

11. A method as claimed in claim 10 wherein said substrate is a first substrate, and said method further comprises:
providing a second substrate;
said forming said movable element forms said movable element on a second surface of said second substrate; and
coupling said second substrate with said first substrate to form a volume between said first and second substrates in which said fixed capacitor plate, said movable capacitor plate, said compliant member, and said movable element are positioned.

12. A method as claimed in claim 10 further comprising forming an actuator on said movable element, said actuator being configured to move said movable element in said abutment with said movable capacitor plate in response to a force applied at said actuator.

13. A method as claimed in claim 12 wherein:
said forming said movable capacitor plate forms said movable capacitor plate at a first structural layer; and
said forming said actuator forms said actuator at a second structural layer that differs from said first structural layer.

14. A method of fabricating a capacitive device comprising:
providing a first substrate;
forming a material layer on a first surface of said substrate to include a fixed capacitor plate;
forming a movable capacitor plate in spaced apart relationship above said fixed capacitor plate and interconnected with said first surface via a compliant member, said compliant member enabling motion of said movable capacitor plate toward said fixed capacitor plate;
providing a second substrate;
forming a movable element on a second surface of said second substrate, said forming said movable element including:
forming a sacrificial layer on said second surface of said second substrate;
forming first and second ends of said movable element extending through said sacrificial layer and coupled to said second surface;
forming a flexible section of said movable element on said sacrificial layer, said flexible section spanning between and connected with said first and second ends; and
removing said sacrificial layer to enable said flexible section to flex along its longitudinal dimension upon actuation; and
coupling said second substrate with said first substrate to form a volume between said first and second substrates in which said fixed capacitor plate, said movable capacitor plate, said compliant member, and said movable element are positioned, said movable element being positioned in spaced apart relationship from said movable capacitor plate, and physically separate from said movable capacitor plate, said movable element adapted to be actuated to cause abutment of said movable element against said movable capacitor plate, said abutment moving said movable capacitor plate toward said fixed capacitor plate to alter a capacitance between said movable and fixed capacitor plates.

* * * * *